United States Patent
Niederer et al.

(10) Patent No.: US 6,426,582 B1
(45) Date of Patent: Jul. 30, 2002

(54) MICROMECHANICAL, CAPACITATIVE ULTRASOUND TRANSDUCER AND METHOD FOR THE MANUFACTURE THEREOF

(75) Inventors: Kurt Niederer, Eggenfelden; Peter-Christian Eccardt, Ottobrunn; Dieter Maier-Schneider, Markt Schwaben, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/573,306

(22) Filed: May 18, 2000

(30) Foreign Application Priority Data

May 19, 1999 (DE) .......... 199 22 967

(51) Int. Cl.[7] ............... H02N 2/00
(52) U.S. Cl. ............... 310/309
(58) Field of Search ............... 310/309, 324; 367/163, 181

(56) References Cited

U.S. PATENT DOCUMENTS

| | | | |
|---|---|---|---|
| 4,192,977 A | * 3/1980 | Stamm | 179/111 E |
| 4,597,099 A | * 6/1986 | Sawafuji | 381/90 |
| 4,979,219 A | * 12/1990 | Lin | 381/190 |
| 5,471,723 A | 12/1995 | Lüder et al. | 29/25.41 |
| 5,619,476 A | 4/1997 | Haller et al. | 367/181 |
| 5,682,075 A | * 10/1997 | Bolleman et al. | 310/309 |
| 5,870,351 A | 2/1999 | Ladabaum | 367/163 |
| 5,894,452 A | 4/1999 | Ladabaum | 367/163 |
| 5,982,709 A | 11/1999 | Ladabaum et al. | 367/170 |
| 6,004,832 A | 12/1999 | Haller et al. | 438/50 |
| 6,262,946 B1 | * 7/2001 | Khuri-Yakub et al. | 367/181 |

FOREIGN PATENT DOCUMENTS

| WO | WO 01/23105 A1 | * 4/2001 | 310/309 |
|---|---|---|---|

OTHER PUBLICATIONS

Suzuki; "A Silicon Electrostatic Ultrasonic Transducer"; Dec. 1989.
Kühnel et al.; "A Silicon Condenser Microphone With Structured Back Plate and Silicon Nitrade Membrane"; Nov. 12, 1991.
Haller et al.; "A Surface Micromachined Electrostatic Ultrasonic Air Transducer"; Dec. 1994.
Schindel et al.; "The Design and Characterization of Micromachined Air–Coupled Capacitance Transducers"; 01/95.
Eccardt; "Surface Micromachined Ultrasound Transducers in CMOS Technology"; 01/96.
Ladabaum et al; "Silicon Micromachined Ultrasonic Immersion Transducer"; Oct. 1, 1996.
Eccardt et al.; "Micromachined Transducers for Ultrasound Applications"; Dec. 1997.
Niederer et al.; "Micromachined Transducer Design for Minimized Generation of Surface Waves"; 10/99.

* cited by examiner

Primary Examiner—Thomas M. Dougherty

(57) ABSTRACT

A micromechanical, capacitative ultrasound transducer having a planar membrane is adapted such for manufacturing an air gap between membrane and cooperating electrode that the membrane collapses. The width of the air gap is thereby defined by nubs located on the membrane that lie against the cooperating electrode.

9 Claims, 1 Drawing Sheet

MICROMECHANICAL, CAPACITATIVE ULTRASOUND TRANSDUCER AND METHOD FOR THE MANUFACTURE THEREOF

FIELD OF THE INVENTION

The present invention relates to capacitative ultrasound transducers that are manufactured micromechanically and, thus, comprise a low-mass membrane.

BACKGROUND OF THE INVENTION

Capacitative ultrasound transducers have a low-mass membrane for sound emission. The pre-condition for great bandwidths in the sound emission having good efficiency is thus established. The emitted power is determined by the driving force and the membrane stroke resulting therefrom. Capacitative transducers are currently preferably utilized for the emission of ultrasound in air.

Given this sound emission, a corresponding stroke is present for a given drive force for the membrane. When the sound emission is then considered in fluids, then a significantly smaller membrane stroke is achieved given the same force than in emission at or in air. The emitted power of the ultrasound transducer and the efficiency thereof thus drop. This is true both for fluids as well as for biological tissue that exhibits similar properties in this application. For a meaningful utilization of the capacitative transducer principle in fluids and biological tissues, it is necessary to reduce the distance between the electrodes of the capacitor representing the ultrasound transducer —the capacitor gap. As a result thereof, a higherfield strength given the same electrical voltage and, thus, a higher drive force are achieved. In the ideal case, the increased drive force causes a membrane stroke that is nearly as great as the height of the capacitor gap. The gap should be maximally 20 nm high, particularly for high frequencies around 50 MHZ and a voltage of 10 V. Such slight heights, however, cannot be currently manufactured.

In the prior art, other transducer principles such as, for example, the piezo-electrical principle are mainly utilized for generating sound in fluids and biological tissues. Given a micromechanical manufacturing process, what is crucial is to manufacture of the extremely small air gap between membrane and cooperating electrode. Previous micromechanical solutions involve a gap height of approximately 100 nm.

SUMMARY OF THE INVENTION

The invention is based on an object of offering a micromechanically manufactured, capacitative ultrasound transducer that comprises a gap height of less than 100 nm. Manufacturing methods are also disclosed.

In an embodiment, the present invention provides a micromechanical, capacitative ultrasound transducer that comprises a cooperating electrode planarly applied on a substrate, the cooperating electrode having a central region. The transducer also comprises a spacer layer disposed on the substrate and/or on the cooperating electrode. The spacer has at least one recess disposed over the central region of the cooperating electrode thereby leaving it exposed. The transducer also includes a micromechanical membrane applied on the spacer layer and which covers the recess of the cooperating electrode. The micromechanical membrane has a side that faces towards the cooperating electrode. This side of the membrane comprises a plurality of nubs. The micromechanical membrane is held down by a photoresist layer or by an electrically applied force so that the nubs of the side of the micromechanical membrane engage the cooperating electrode.

In an embodiment, the electrically applied force is generated by applying a DC voltage.

In an embodiment, a spacing between the nubs and the cooperating electrode is formed due to resilient properties of the photoresist layer and the spacing can be eliminated by an electrically applied force.

In an embodiment, the nubs encompass a recess.

In an embodiment, the nubs are circularly arranged.

In an embodiment, the nubs have a uniform height ranging from 10 nm to 100 nm.

In an embodiment, a central region of the membrane comprises at least one stiffening layer disposed on a side of the membrane lying opposite the nubs.

In an embodiment, the cooperating electrode comprises polysilicon.

In an embodiment, a plurality of micromechanical ultrasound transducers are positioned neighboring one another to form a two-dimensional transducer arrangement.

The present invention also provides a method for manufacturing the micromechanical ultrasound transducer described above. As a hold down-means for the membrane, a photoresist layer is applied and thereafter photolithographically removed in the central region of the cooperating electrode. The ultrasound transducer is charged with gas pressure in an autoclave so that the nubs are pressed against the cooperating electrode and the photoresist layer is simultaneously cured.

In an embodiment, a gap between the nubs and the cooperating electrode arises when the pressure is removed, and this gap is closed by the application of a DC voltage.

The invention is based on the perception that capacitative ultrasound transducers having an air gap of, for example, 600 nm that are manufactured in a micromechanical standard process can be modified such that the desired properties can be realized. An ultrasound transducer manufactured with a planar membrane is thus subjected to a procedure that assures a desired, extremely small gap height between the capacitor electrodes.

To this end, nubs that exhibit a uniform height are applied on the membrane side that lies opposite the cooperating electrode. Their height lies in the range from 10 through 100 nm.

The membrane is deformed such from the planar structure in this method that the nubs thereof lie against the cooperating electrode. This is true for the central part of the membrane or, respectively, of the cooperating electrode located in or over a recess. The nubs thereby lie firmly against the cooperating electrode. The region between the nubs and/or the region between the nubs and a clamping of the membrane is respectively available as elastic membrane region for sound emission. It is thereby to be taken into consideration that the use of a photoresist has hold-down means essentially covers the lateral regions between the nubs and the membrane clamping and renders this ineffective.

Overall, a micromechanically manufactured ultrasound transducer having a planar membrane is developed such that its membrane is partially collapsed. In this condition, the membrane is attracted or, respectively, arrested such that it lies against the cooperating electrode. This condition can ensue electrically or mechanically. Given the disclosed ultrasound transducer, the physical contact between membrane and cooperating electrode is represented by the nubs located on the membrane. A complete collapse wherein zones of the membrane located next to the nubs are also in contact with the cooperating electrode is avoided.

Since the cooperating electrode is composed of a material, usually silicon, that superficially oxidizes, no short arises. In this collapsed condition, a uniform air gap having minimum height is present. Given a corresponding electrical excitation with, for example, 50 MHZ and 10 V, one can count on a correspondingly increased drive force for the membrane.

A gap between nubs and cooperating electrode subsequently recurring during manufacture due to resiliency of the photoresist can be preserved dependent on the application or can be advantageously closed by an electrically applied force.

Other objects and advantages of the present invention will become apparent upon reading the following detailed description and appended claims, and upon reference to the accompanying drawings.

BRIEF DESCRIPTION OF THE DRAWINGS

For a more complete understanding of the present invention, reference should now be made to the embodiments illustrated in greater detail in the accompanying drawings and described below by way of examples of the present invention.

It should be understood that the drawings are not necessarily to scale and that the embodiments are sometimes illustrated by graphic symbols, phantom lines, diagrammatic representations and fragmentary views. In certain instances, details which are not necessary for an understanding of the invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 1:
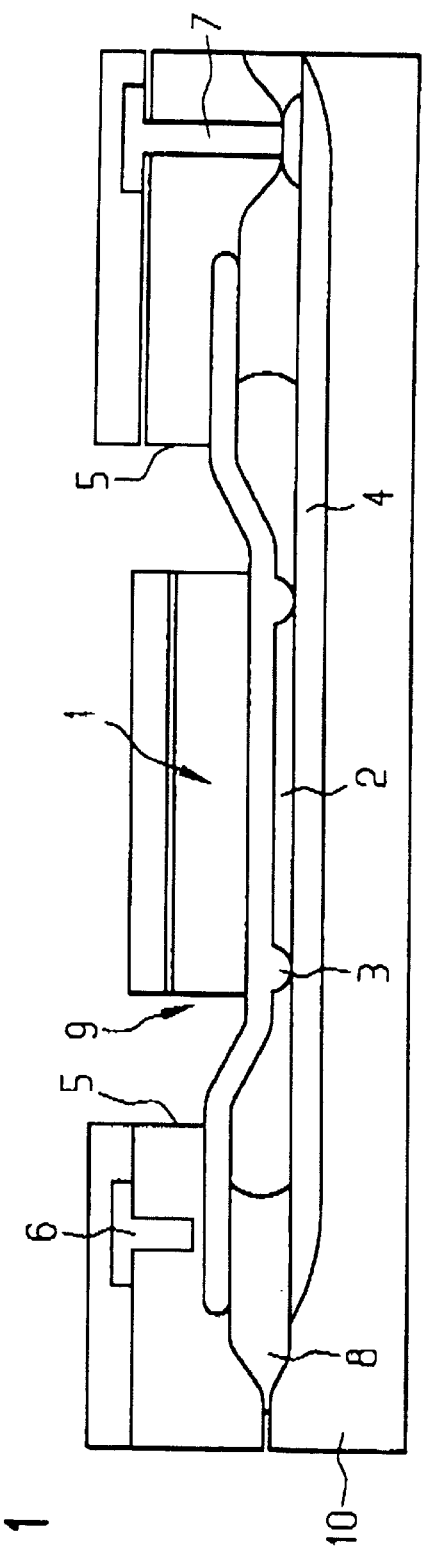
FIG. 1 is a cross-sectional view through an ultrasound transducer made in accordance with the present invention with a membrane that has been collapsed by an adjacent DC voltage.

The cross-sectional illustration of FIG. 1 illustrates the structure of a micromechanically manufactured, capacitative ultrasound transducer having a substrate 10, an electrode 4 embedded therein, a spacer layer 8 with a recess and a membrane 1, which is positioned over the recess and fixed by a clamping 5. The electrical connections occur with the contactings 6, 7. The collapsed condition of the membrane 1 shown in FIG. 1 yields a defined gap due to the contact of the nubs 3 with the cooperating electrode 4, namely in the capacitor presented by the membrane 1 land the cooperating electrode. The width of the air gap 3 corresponds to the height of the nubs 3. In this condition, the membrane can oscillate in the central region between the illustrated nubs 3 and can also vibrate in the edge regions between clamping 5 and the nubs 3. The stiffening layer 9 can be composed of one or of a plurality of layers. It stiffens the central part of the membrane 1. The stiffening layer 1 can be varied in structure and in composition for setting a desired emission behavior of the ultrasound transducer.

Figure 2:
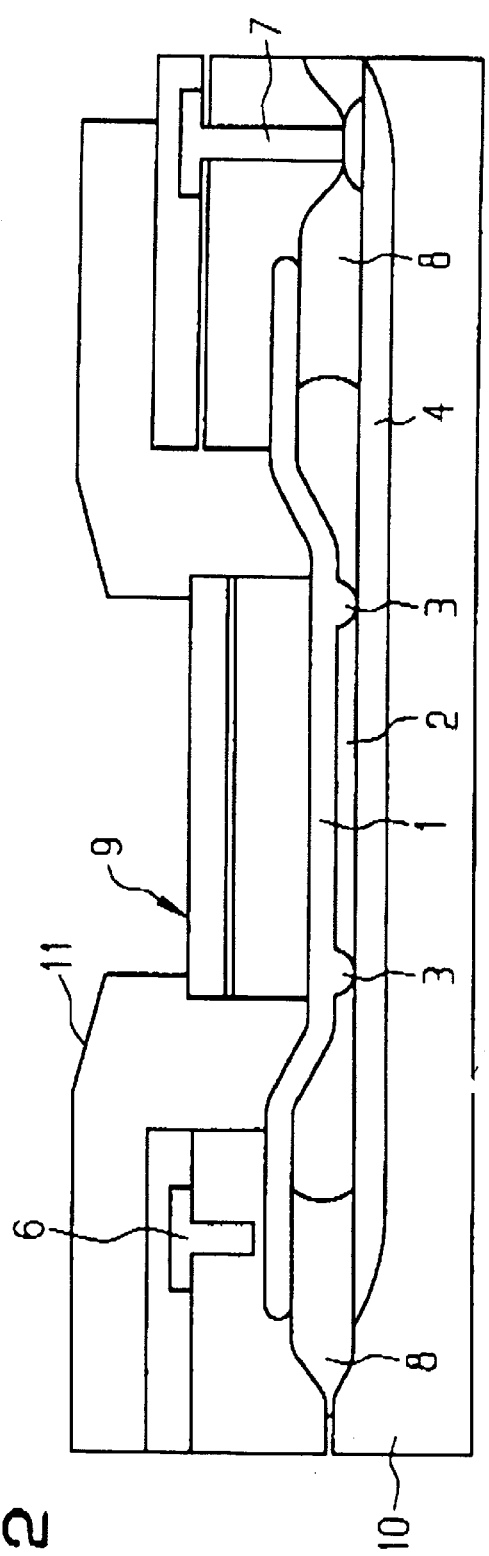
FIG. 2 shows an ultrasound transducer according to FIG. 1, whereby the collapsed position of the membrane is achieved by an applied and correspondingly deformed photoresist.

FIG. 2 shows an identical presentation as in FIG. 1 in terms of the structure. The photoresist 11 applied as uppermost layer comprises a recess over the central region of the membrane 1 in order to assure the emission of the ultrasound transducer. The photoresist has contact not only with the clamping 5 but also extends up to the stiffening layer 9 and partially up to the membrane 1. Due to this fashioning, the membrane 1 is pressed down and fixed, so that the nubs 3 lie against the cooperating electrode 4.

In FIG. 1, the collapsed condition of the membrane 1 is achieved by applying a DC voltage. In FIG. 2, this is mechanically effected by the photoresist 11. If a slight spacing of the nubs 3 from the cooperating electrode 4 should exist or occur in the illustration in FIG. 2 due to slight resiliency of the photoresist 11 after the manufacture of the condition corresponding to FIG. 2, then a correspondingly applied force can lead to the completely collapsed condition of the membrane 1 here as well with a corresponding DC voltage. A DC voltage applied to the ultrasound transducer is thus utilized in order to set a collapsed condition of the membrane 1.

For protecting an ultrasound transducer or an arrangement of ultrasound transducers, a silicon nitride (SiN) protective layer covering all can be applied. The standard manufacturing method for nubbed, micromechanical component parts is known. The nubs were hitherto used to prevent a surface-wide sticking of the component parts to one another during the manufacture (anti-sticking). In this case, the nubs 3 are used to define a cavity as capacitor gap that exhibits an extremely slight width defined by the height of the nubs. The ultrasound transducer is manufactured with a planar membrane and coated with photoresist. The photoresist 11 is photolithographically removed from the middle of the membrane, the central region of the membrane 1. The ultrasound transducer is introduced into an autoclave (furnace with pressure chamber). The membrane is pressed against the cooperating electrode 4 with its nubs 3 as a result of air pressure. Due to subsequent heating under pressure, the photoresist 11 hardens in the deformed condition. After removal of pressure and temperature, the membrane remains deformed. A gap between nubs 3 and cooperating electrode 4 that potentially arises due to the removal of the pressure can be in turn closed by the application of; a DC voltage. This measure, however, is not compulsory. The method execution applies both to one ultrasound transducer as well as to an arrangement of a greater plurality of ultrasound transducers.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A micromechanical, capacitative ultrasound transducer comprising:
   a cooperating electrode and a substrate, the cooperating electrode being disposed on the substrate, the cooperating electrode having a central region,
   a spacer layer disposed on the substrate and/or on the cooperating electrode, the spacer layer and at least one recess disposed over the central region of the cooperating electrode,
   the transducer further comprising a micromechanical membrane disposed on top of the spacer layer and covering the recess thereof, the micromechanical membrane having a first side facing towards the cooperating electrode, the first side comprising a plurality of nubs, the micromechanical membrane being held down by a photoresist layer or by an electrically applied force, so that the nubs of the first side of the micromechanical membrane engage the cooperating electrode.

2. The micromechanical ultrasound transducer of claim 1 wherein the electrically applied force can be generated by applying a DC voltage.

3. The micromechanical ultrasound transducer of claim 1 wherein a spacing between the nubs and the cooperating electrode is formed due to resilient properties of the photoresist layer and can be eliminated by an electrically applied force.

4. The micromechanical ultrasound transducer of claim 1 wherein the nubs encompass a recess.

5. The micromechanical ultrasound transducer of claim 4 wherein the nubs are circularly arranged.

6. The micromechanical ultrasound transducer of claim 1 wherein the nubs have a uniform height ranging from 10 to 100 nm.

7. The micromechanical ultrasound transducer of claim 1 wherein a central region of the membrane comprises at least one stiffening layer on a side lying opposite the nubs.

8. The micromechanical ultrasound transducer of claim 1 wherein the cooperating electrode comprises polysilicon.

9. The micromechanical ultrasound transducer of claim 1 wherein a plurality of micromechanical ultrasound transducers are positioned neighboring one another to form a two-dimensional transducer arrangement.

* * * * *